United States Patent [19]

Hayafuji

[11] Patent Number: 4,608,493

[45] Date of Patent: Aug. 26, 1986

[54] FARADAY CUP

[75] Inventor: Yoshinori Hayafuji, Tokyo, Japan

[73] Assignee: Sony Corporation, Tokyo, Japan

[21] Appl. No.: 492,801

[22] Filed: May 9, 1983

[51] Int. Cl.$^4$ .............................................. H01J 37/04
[52] U.S. Cl. .................................. 250/397; 250/396 R
[58] Field of Search ...................... 250/397, 398, 492.2, 250/492.3, 491.1, 310

[56] References Cited

U.S. PATENT DOCUMENTS

| 3,745,358 | 7/1973 | Firtz et al. | 250/397 |
| 4,086,491 | 4/1978 | Vaughan | 250/397 |

FOREIGN PATENT DOCUMENTS

| 0030280 | 3/1978 | Japan | 250/492.3 |
| 0127285 | 10/1979 | Japan | 250/397 |
| 0069077 | 5/1980 | Japan | 250/397 |

Primary Examiner—Bruce C. Anderson
Assistant Examiner—Paul A. Guss
Attorney, Agent, or Firm—Lewis H. Eslinger; Alvin Sinderbrand

[57] ABSTRACT

A Faraday cup adapted for measuring the energy density of an electron beam which scans the cup and is of generally strip-shaped cross-section, includes a substrate having a cavity in a surface thereof, a layer of electrically conductive material next adjacent to and conforming to the surface of the substrate, a layer of electrically isolating material having an aperture extending therethrough above the cavity and being substantially level and next adjacent to the layer of electrically conductive material except at margins of the aperture where the layer of electrically isolating material overhangs the cavity, and a metallic layer next adjacent to said layer of electrically isolating material and which has an opening aligned above said aperture and having a maximum dimension less than the width of the strip-shaped cross-section of the beam at a location along the latter where the beam scans the cup.

8 Claims, 21 Drawing Figures

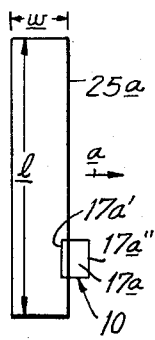 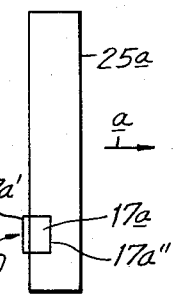
FIG.4A  FIG.4B  FIG.4C
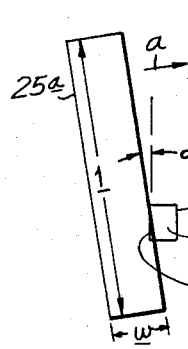 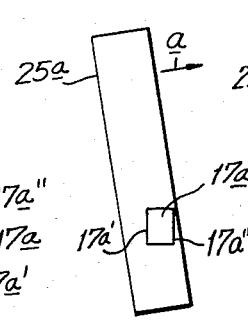 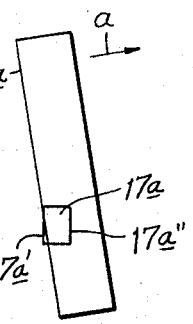
FIG.4D  FIG.4E  FIG.4F
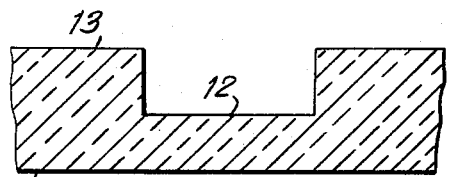 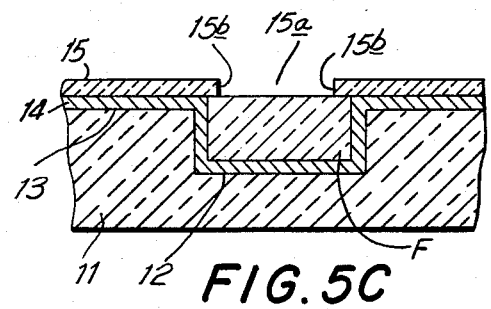
FIG.5A  FIG.5C
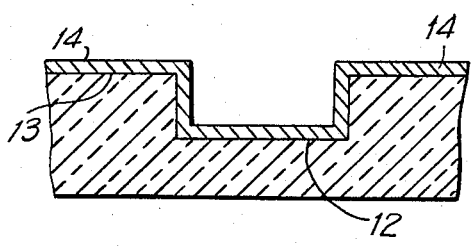 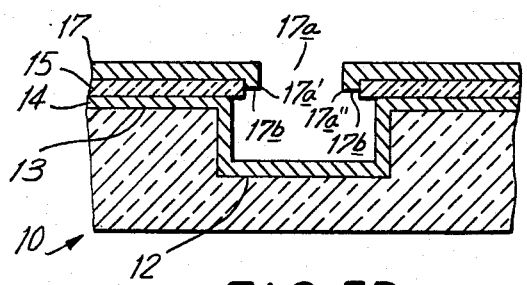
FIG.5B  FIG.5D

FARADAY CUP

BACKGROUND OF THE INVENTION

1. Field Of The Invention

The present invention relates to so-called Faraday cups used for measuring various parameters associated with an electron beam, and more particularly is directed to a Faraday cup adopted for measuring the width, current density and energy density of an electron beam of generally strip-shaped cross-section.

2. Description Of The Prior Art

For controlling the generation of an electron beam by a gun having a cathode, anode and grid electrodes, and the focussing of the beam by electromagnetic or electrostatic focusing means, the voltage applied to one or more of the gun electrodes or the spacing therebetween, or the current or voltage supplied to the focusing means may be varied. In determining the voltage, current, and spacing variation that are required, various parameters associated with the electron beam, such as the width, current density and energy density are measured with the aid of a device, commonly referred to as a Faraday cup. For measuring these parameters, the electron beam is made to scan across an opening of the cup for producing a flow of current from the latter. More particularly, as the beam begins to cross the leading edge of the cup opening, current begins to flow from the cup and increases in value as more and more of the cross-sectional area of the beam is encompassed by the cup opening. Typically, the width of a conventional cup opening is larger than the cross-sectional width of the beam. Therefore, as more of the cross-sectional width of the beam crosses over the leading edge of the cup opening, more of the beam cross-sectional area is encompassed by the cup opening resulting in an increased current flow from the cup. Assuming that the value of the current reaches a maximum when the cross-sectional width of the beam has completed crossing the leading edge of the cup opening, the cross-sectional width of the beam can be determined from the scanning rate of the beam and the time required for the current to change from a minimum to a maximum value. Current density and energy density are readily determined from the maximum current value that is measured.

Electron beams can be characterized by their cross-sectional shape. For example, a beam of generally circular cross-section is commonly referred to as an electron spot beam whereas a beam of generally strip-shaped, cross-section is identified as an electron strip beam.

In the case of an electron spot beam of circular cross-section, the time required for the cross-sectional width of the spot beam to cross the leading edge of the cup opening is independent of the orientation angle between the scanning path of the beam and a normal to the leading edge of the cup opening. More particularly, the diameter of the spot beam is, in fact, the cross-sectional width of the beam measured at right angles to the leading edge of the cup regardless of such angle. Accordingly, the time required for the cup current to change from a minimum value to a maximum value is the same regardless of the orientation angle, and the measured beam width is not subject to variation and consequential error due to variation in the orientation angle. Furthermore, since the entire cross-sectional area of a typical spot beam fits within the cup opening, the maximum value of current measured with the cup, which is dependent on the maximum beam cross-sectional area encompassed by the cup opening, remains the same independent of the orientation angle. Therefore, the value of the orientation angle does not affect the current density or energy density of an electron spot beam determined by a conventional Faraday cup.

In the case of an electron strip beam, however, variation in the orientation angle results in variation in the beam width, current density and energy density as measured with a known Faraday cup. For example, if the length of the strip-shaped cross-section of the beam is parallel to the leading edge of the cup opening, that is, if the orientation angle is 0° so that the strip beam approaches the leading edge of the cup opening in a direction parallel to the direction of the cross-sectional width, then the time required for the cup current to rise from a minimum value to a maximum value corresponds to the cross-sectional width of the beam and, of course, the scanning speed. However, when the orientation angle is such that the strip beam is skewed relative to the leading edge of the cup, the time required for the cup current to rise from a minimum value to a maximum current value will vary or be increased from the time required when the length of the strip-shaped cross-section of the beam is parallel to the leading edge of the cup opening. As can be readily appreciated, this increased time is determined by the orientation angle as well as by the cross-sectional width of the beam. Thus, the beam width cannot be accurately determined when the orientation angle is other than 0°. Furthermore, the opening of a conventional Faraday cup cannot accommodate the entire cross-sectional area of the strip beam. Thus, depending on the orientation angle, different maximum cross-sectional areas of the strip beam will fit within the cup opening. Accordingly, the maximum current values flowing from the Faraday cup may vary with the orientation angle. Therefore, changes in the orientation angle can cause different and inaccurate current and energy densities to be measured with a conventional Faraday cup.

For avoiding such inaccurate current and energy density measurements, the size of the cup opening may be increased to encompass the entire cross-sectional area of the strip beam therein. However, in that case, the current distribution of the strip beam along the length of its strip-shaped cross-section cannot be measured. More particularly, a number of cups spaced along the length of the strip-shaped cross-section of the beam are necessary in order to determine the current distribution in the direction along the length of the strip-shaped cross-section.

OBJECTS AND SUMMARY OF THE INVENTION

Accordingly, it is an object of the present invention to provide a method of measuring the width, current density and energy density of an electron beam of generally strip-shaped cross-section and which avoids the above-mentioned drawbacks of the prior art.

More specifically, it is an object of the present invention to provide a method using a Faraday cup for accurately measuring the width, current density and energy density of an electron beam of generally strip-shaped cross-section without regard to the orientation angle, that is, the angle between the length of the strip-shaped cross-section and the leading or forward edge of the cup opening as the beam scans the Faraday cup.

In accordance with an aspect of this invention, a method of measuring the energy density of an electron beam of generally strip-shaped cross-section by a Faraday cup across which the beam is made to scan in a direction transverse to the length of said strip-shaped cross-section is characterized by providing the cup with an opening having a maximum dimension less than the width of said strip-shaped cross-section at a location along said beam where the latter scans said cup.

Furthermore, the above method can be utilized in controlling the generation and focus of the electron strip beam by measuring the flow of current produced by the cup and controlling the width, current density and current distribution of the beam in accordance with the measured current flow.

Further, it is a feature of this invention to provide a method of making a Faraday cup, in which a cavity is etched in a surface of a substrate, a layer of electrically conductive material is applied to said substrate surface, a layer of electrically isolating material is applied to said layer of electrically conductive material, a window is etched in said layer of electrically isolating material at a location above said cavity; and a metallic layer is applied on said layer of electrically isolating material with a window being provided in said metallic layer in alignment with said window in said layer of electrically isolating material.

It is still another feature of the present invention to provide a Faraday cup for use in measuring the energy density of the electron strip beam while the latter scans the Faraday cup, comprising a substrate having a cavity in a surface thereof, a layer of electrically conductive material next adjacent to and conforming to said surface of the substrate, a layer of electrically isolating material having an aperture extending therethrough and located above said cavity, said layer of electrically isolating material being substantially level and next adjacent to said layer of electrically conductive material except at margins of said aperture where said layer of electrically isolating material overhangs said cavity, and a metallic layer next adjacent to said layer of electrically isolating material and which has an opening aligned above said aperture and having a maximum dimension less than the width of the strip-shaped cross-section of the beam at a location along the beam where the latter scans said cup.

The above, and other objects, features, and advantages of this invention will become apparent from the following detailed description which is to be read in conjunction with the accompanying drawings.

BRIEF DESCRIPTION OF THE DRAWINGS

FIGS. 4A-4F are diagrammatic plan views of Faraday cups in accordance with the present invention being scanned by an electron beam from the apparatus of FIG. 1;

FIGS. 5A-5D are fragmentary sectional views illustrating successive steps involved in making the cup of FIG. 2;

DETAILED DESCRIPTION OF PREFERRED EMBODIMENTS

Figure 1:
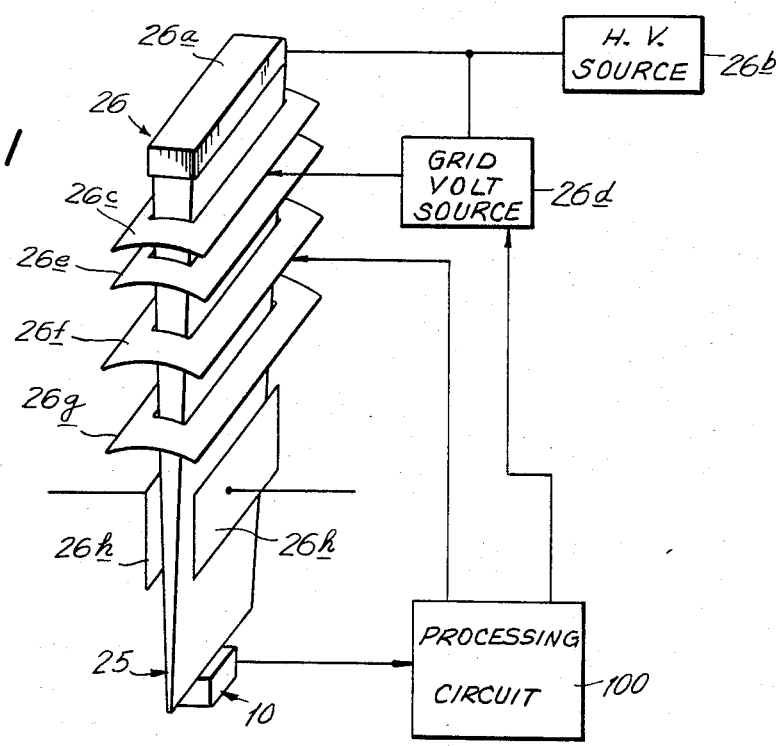
FIG. 1 is a schematic diagram of an apparatus for generating an electron beam of generally strip-shaped cross-section and which can be used with one or more Faraday cups according to the present invention for measuring the width, current density, current distribution and energy density of the beam.
Figure 2:
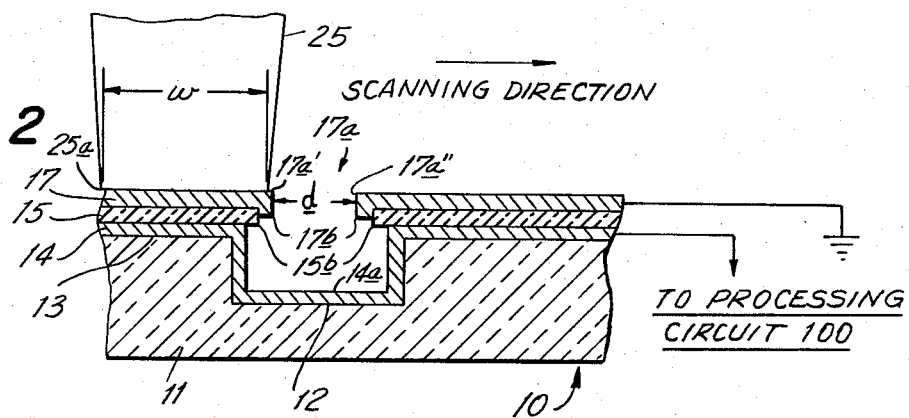
FIG. 2 is fragmentary sectional view showing a Faraday cup in accordance with an embodiment of the present invention.

Referring initially to FIG. 1, an electron beam 25, which has been enlarged for purposes of illustration only, is shown to be of a generally strip-shaped cross-section and impacts with intense energy, along a narrow, line-like area 25a of width w, on a Faraday cup structure 10. More particularly, electron strip beam 25 is shown to be provided by an electron beam source, such as a gun 26, and is formed by extractions of electrons from a uniformly emitting strip-like thermionic cathode 26a of high aspect ratio. A suitable high voltage generator 26b is connected to cathode 26a so as to heat the latter. An extraction grid 26c connected to a grid controlling voltage source 26d, is spaced a few millimeters from cathode 26a and provided with a purveyance such that the required current density can be obtained with a few kilovolts or less of an extraction pulse. An anode 26e is disposed near grid 26c to concentrate and focus a narrow strip electron beam which is then injected at an aperture 26f in a main electrostatic accelerating gap. The geometry of aperture 26f is such that the electric field further focuses the strip laterally during the initial stages of acceleration in the electrostatic accelerating main gap. Electron strip beam 25 is then directed through a ground aperture 26g to provide its narrow, line-like impact area 25a of intense energy of width w on the upper surface of Faraday cup structure 10 (FIG. 2). Displacement of electron beam 25 relative to a Faraday cup structure 10 for causing impact area 25a to scan an opening 17a can be effected by a deflection system including electrostatic plates 26h which are suitably energized to cause deflection of electron beam 25 at right angles to the length of the strip-like cross-section of the beam. Alternatively, scanning of opening 17a by impact area 25a can be achieved by maintaining beam 25 stationary and suitably moving cup structure 10 relative thereto.

In the Faraday cup structure 10 according to an embodiment of the present invention shown on FIG. 2, a substrate 11 of electrically isolating material has a cavity 12 formed in a substantially level surface 13 thereof, and a layer 14 of electrically conductive material and conforms to level surface 13 and to the surfaces of cavity 12 of substrate 11. Layer 14, which forms an electrode for cup structure 10, as will be explained in further detail below, may be of a refractory metal. Alternatively, portion 14a of layer 14, which is next adjacent to and conforming to the surfaces cavity 12, may be of graphite while the remaining portions of layer 14, which are on the level surface 13 of substrate 11, are of a refractory metal. In either case, the refractory metal may be, for example, molybdenum, tungsten or platinum.

A layer 15 of electrically isolating material is applied over layer 14 and has an aperture 15a extending therethrough above cavity 12. Layer 15 is substantially level and is next adjacent to layer 14 except at margins 15b of aperture 15a where layer 15 overhangs cavity 12. Electrically isolating layer 15 is an insulator having a melting point of a sufficiently high value so that layer 15 will not begin to melt when cup structure 10 is scanned by beam 25. In particular, layer 15 is provided so as to electrically isolate layer 14 from beam 25 except at portions 14a which are next adjacent the surface of cavity 12. Thus, as will be discussed below, layer 15 advantageously limits impacting of beam 25 on layer 14 to a predetermined area of the latter.

Faraday cup structure 10 further includes a metallic layer 17 disposed next adjacent to layer 15 and having opening 17a therein aligned with aperture 15a. In accordance with this invention, opening 17a has a maximum dimension d which is substantially less than the width w of the narrow, line-like impact area 25a of beam 25. Edge portions 17b of layer 17 overhang margins 15b of aperture 15a. Metallic layer 17 may be formed of a refractory metal having a melting point above 300° C. Layer 17 is desirably connected to ground or earth potential to prevent a negatively charged build-up on electrically isolating layer 15 as beam 25 scans cup structure 10. More specifically, as beam 25 scans cup structure 10, electrons issuing from beam 25 and tending to be retained in electrically isolating layer 15 near the outer portion thereof are drawn off to ground through layer 17. Without layer 17, the resulting charge build-up on layer 15 would interfere with the focusing of beam 25 so that the desired parameters of beam 25 could not be effectively measured by cup structure 10.

Operation of Faraday cup structure 10 is as follows: Electron beam 25, which travels in a direction transverse to the length of its strip-shaped cross-section, is relatively displaced across cup structure 10 so that impact area 25a scans opening 17a. As impact area 25a begins to cross opening 17a, the electron beam begins to impact upon portion 14a of electrically conductive layer 14, that is, upon the electrode of cup structure 10, so as to produce a current flow therealong. Electrode 14 is connected to an appropriate processing circuit 100 in which the current flow from electrode 14 is measured and values of the beam width, current density, current distribution and energy density are determined from the measured current flow, whereupon, the voltages applied to electrodes 26c, 26e, 26f and/or the spacing therebetween are varied in accordance with the determined current density, current distribution and beam width in order to maintain desired values for such characteristics of beam 25.

As will be readily appreciated, when beam 25 is made to scan across Faraday cup structure 10 in the direction of arrows a on FIGS. 4A–4C, no current flows from cup structure 10 until electron beam impact area 25a crosses a leading edge 17a' of opening 17a (FIG. 4A). As impact area 25a of the beam continues to move across leading edge 17a' (FIG. 4B), more and more of the cross-sectional area of impact are 25a is encompassed by opening 17a which increases the current flowing from cup structure 10. Assuming the impact area 25a to have a uniform current distribution thereacross, once the impact area 25a completely covers opening 17a, the current flow produced by cup structure 10 will remain constant at a maximum value. For example, as graphically shown in FIG. 3, current from cup structure 10 is at a zero value as impact area 25a approaches leading edge 17a' of opening 17a. At time $t_1$, impact area 25a begins crossing leading edge 17a' (FIG. 4A) resulting in current flowing from cup 10. As impact area 25a continues across the leading edge 17a' of opening 17a, the current flow from cup structure 10 rises until, at time $t_2$, the current flow reaches a maximum value which corresponds to impact area 25a having reached the trailing edge 17a'' of opening 17a so as to completely encompass the latter (FIG. 4B). Current flow from cup 10 remains at a maximum value until, at time $t_3$ (FIG. 3) impact area 25a completes the crossing of leading edge 17a' and begins to progressively uncover opening 17a (FIG. 4C). The value of current then begins to gradually decline until, at time $t_4$, impact area 25a completes the crossing of trailing edge 17a'' resulting in cessation of current flow from cup structure 10.

The width w of the impact area 25a of beam 25 can be determined from the scanning speed and the time interval required for impact area 25a to complete the crossing of leading edge 17a'. In other words, the width w of impact area 25a is directly proportional to and can be determined from the time interval $(t_3-t_1)$ so long as, in accordance with this invention, the maximum dimension d of opening 17a is substantially smaller than the width w of the impact area 25a of the electron strip beam 25.

Figure 3:
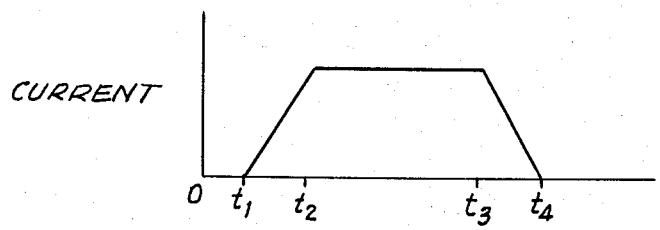
FIG. 3 is a graphical illustration to which reference will be made in explaining the operation of the Faraday cup of FIG. 2.

As previously noted, the strip-shaped cross-section of beam 25 may form an angle $\alpha$, known as the orientation angle, with respect to leading edge 17a'. In FIGS. 4A–4C, the orientation angle is 0°, that is, the leading edge 17a' and the length l of the strip-shaped cross-section of beam 25 are parallel with each other. In FIGS. 4D–4F, the orientation angle $\alpha$, for illustrative purposes, is shown to be 10°, that is, the length l of the strip-shaped cross-section of beam 25 is at an angle of 10° relative to leading edge 17a' of the opening 17a of Faraday cup structure 10. However, so long as the maximum dimension d of opening 17a is smaller than the width w of impact area 25a, as in accordance with this invention, the displacement of impact area 25a in the direction of the arrows a from the position of FIG. 4D, at which the impact area 25a begins to move across leading edge 17a' of opening 17a at the time $t_1$ on FIG. 3, through the position of FIG. 4E to the position of FIG. 4F, at which the impact area 25a begins to move away from the leading edge 17a' at the time $t_3$ on FIG. 3, is still precisely equal to the width w of impact area 25a. In other words, when using the Faraday cup structure 10 according to this invention, the time $t_3-t_1$ is independent of the orientation angle $\alpha$. Therefore, with the scanning speed of beam 25 being known, the time $t_3-t_1$ can be measured to provide a reliable indication of the width w of impact area 25a.

Similarly, in connection with the current and energy densities of beam 25, changes in the orientation angle will not result in different and inaccurate measurements. More specifically, and assuming that the beam has a current density that is substantially uniform across its width, as impact area 25a moves across opening 17a, in the time between $t_2$ and $t_3$ on FIG. 3 the entire opening 17a will be encompassed by impact area 25a for all values of the orientation angle so that the maximum current flow will be the same for all values of the orientation angle $\alpha$. Therefore the current density and energy density, which are readily determined from the maximum value of current flowing from cup structure 10, will not vary due to different orientation angles.

Referring once again to FIG. 2, it will be seen that, in the embodiment of the invention there illustrated, cavity 12 has a cross-section with right-angled corners. Such shape is due to the crystallographic orientation of the substrate 11. For the purpose of defining such orientation, the orientation of a planar surface will be defined, as is conventional, in terms of the normal thereto denoted by the notation {x,y,z}. Thus, a planar surface in the x-y plane has an orientation along the z-axis, that is, for example, a {001} orientation. In particular, when substrate 11 is a silicon wafer of {110} orientation, as on FIG. 2, the cross-sectional area of the cavity 12 formed by etching has right-angled corners. In contrast thereto, when substrate 11 is a silicon wafer of {001} orientation, cavity 12 formed by etching has a substantially V-shaped cross-section with its surfaces enclosing an angle of approximately 60°. In either case, that is, whether using a silicon wafer of {001} or {110} orientation, cavity 12 is provided with a minimal height of approximately 1 micron.

A method of making the Faraday cup structure 10 in accordance with the present invention will now be described with reference to FIGS. 5A–5D. As shown in FIG. 5A, cavity 12 is formed in surface 13 on substrate 11, for example, by chemical etching. As shown on FIG. 5B, layer 14 of electrically conductive material is applied to surface 13 of substrate 11, for example, by sputtering the electrically conductive material onto surface 13 and onto the surfaces of cavity 12. A filler F of polycrystalline or amorphous material, such as, polysilicon, may be deposited in cavity 12 (FIG. 5C) to provide a level surface for layer 15 of electrically isolating material which is applied to layer 14, for example, by chemical vapor deposition. A window aperture 15a is next etched in layer 15 at a location above cavity 12, but with the distance between margins 15b of aperture 15a being smaller than the width of cavity 12. Then, filler F is removed, for example, by etching with HF, HNO₃, AND CH₃COOH, for leaving layer 15 substantially level and next adjacent to layer 14 except at margins 15b of aperture 15a where layer 15 overhangs cavity 12. Metallic layer 17 is then applied to layer 15, for example, by sputtering or depositing the refractory metal material onto layer 15. The window or opening 17a is formed in layer 17 in alignment with aperture 15a, for example, by chemical etching with HF, HNO₃ or CH₃COOH, as in FIG. 5D. Preferably, a filler (not shown) may be deposited in cavity 12 prior to the deposit of layer 17 so that the latter will be substantially level on layer 15 except at margins 17a' and 17a'' of opening 17a where, due to the limited area exposed to etching, the latter overhangs cavity 12, as at 17b.

Figure 6A:
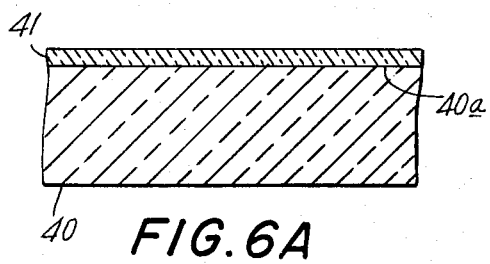
FIGS. 6A-6F are fragmentary sectional views illustrating successive steps involved in making a cup in accordance with another embodiment of the present invention.
Figure 6D:
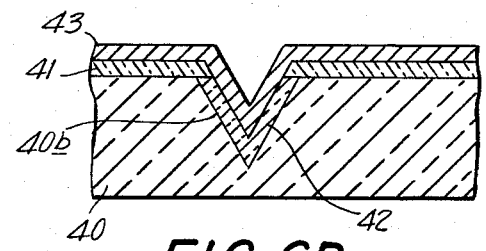
Figure 6B:
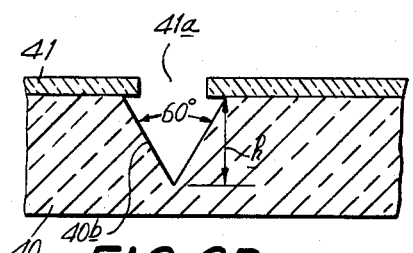
Figure 6E:
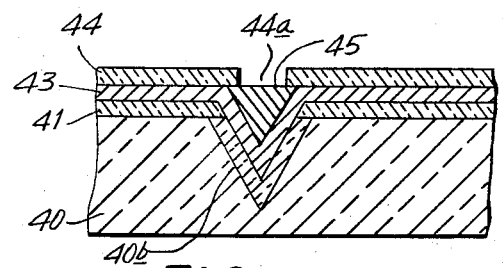
Figure 6C:
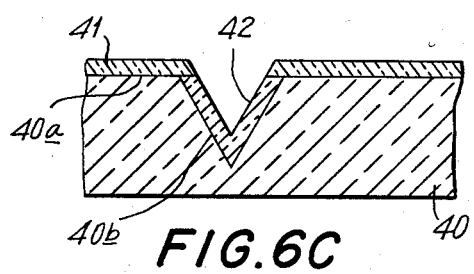
Figure 6F:
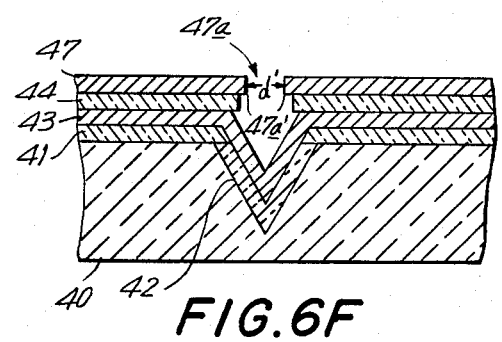

In producing a Faraday cup in accordance with another embodiment of the present invention, a first layer 41 of electrically isolating material, such as SiO₂, is applied to a substrate 40 of a single crystal semiconductor (FIG. 6A), which, more particularly, is a wafer of silicon single crystals having an orientation of {001}. Layer 41 can be applied by annealing the same to a surface 40a of substrate 40. As shown in FIG. 6B, a window 41a is etched in layer 41, for example by using hydrofluouric acid. A cavity 40b is etched in substrate 40 under window 41a by continuing to chemically etch through window 41a using, for example, a mixture of hydrofluouric acid and an alkaline. As previously noted, the cavity formed in substrate {001} orientation inherently has a substantially V-shaped cross-section enclosing an angle of approximately 60° and the minimal height h of cavity 40b is approximately 1 micron. Further, as shown, the etching of substrate 40 through window 41a serves to undercut layer 41. A second layer 42 of electrically isolating material, such as SiO₂, is then applied by annealing to the surfaces of cavity 40b so as to form a continuous electrically isolating layer next adjacent to and conforming to the top surface 40a of substrate 40 and to the surfaces of cavity 40b, as shown in FIG. 6C. Next, a layer 43 of electrically conductive material is applied over layer 41 and layer 42 so as to be next adjacent to and conforming thereto, as shown on FIG. 6D. Layer 43, which serves as the cup electrode, may be of a refractory metal such as, for example, molybdenum, tungsten or platinum. Alternatively, that portion of layer 43 in cavity 40b may be of graphite while the substantially level portions of layer 43 are of a refractory metal. Layer 43 may be applied by sputtering th electrically conductive material onto layers 41 and 42. A layer 44 of electrically isolating material, such as SiO₂, is then applied on layer 43, for example, by chemical vapor disposition, and a window 44a is etched in layer 44 at a location above cavity 40b. Prior to applying layer 44 on layer 43, a filler 45 of polycrystalline or amorphous material, such as polysilicon, is desirably applied over layer 43 in cavity 40b so as to provide a substantially level surface for chemical vapor disposition of layer 44, as shown in FIG. 6E. In such desirable embodiment, chemical etching of layer 44 to form window 44a is followed by etching filler 45 using, for example, HF, HNO₃ or CH₃COOH so as to again expose layer 43. The filler 45 is employed to protect underlying layer 43 from the etching material used to form window 44a and also to permit the layer 44 to be planar or level and to have portions of window 44a which overhang cavity 40b. Finally, a metallic layer 47 of a refractory metal having a melting point over 300° C. is applied to layer 44, for example, by sputtering the metallic material onto the latter. A window 47a in layer 47 aligned with window 44a is then formed in metallic layer 47, for example, by chemical etching with HF, HNO₃ or CH₃COOH, as illustrated in FIG. 6F. Window 47a has a maximum dimension d' which is less than the width w of electron strip beam 25. Portions 47b are desirably made, similar to portions 17b of FIG. 2, to overhang the margins of aperture 44a. The operation of the Faraday cup shown in FIG. 6F, is similar to that described with respect to cup 10 with the layers 43, 44 and 47 of FIG. 6F corresponding functionally to layers 14, 15 and 17 of FIG. 2.

Figure 7:
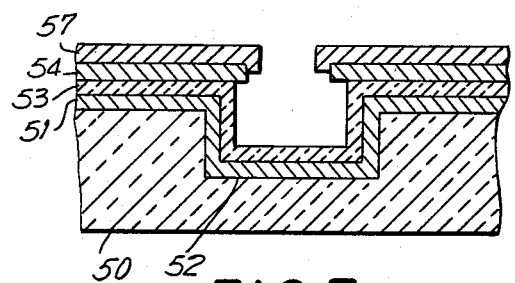
FIG. 7 is a fragmentary sectional view of still another embodiment of the present invention.

Referring now to FIG. 7, it will be seen that, in another embodiment of the present invention similar to that of FIG. 6F, a substrate 50 has a crystallographic orientation of {110} rather than {001}. Due to the foregoing, when etching a cavity in a surface of substrate 50, the cross-section thereof is rectangular with two 90° corners rather than being V-shaped. The Faraday cup in FIG. 7 operates similarly to the cup in FIG. 6F, with the layers identified at 51,52,53,54 and 57 on FIG. 7 corresponding to the layers 41,42,43,44 and 47, respectively on FIG. 6F.

Figure 8:
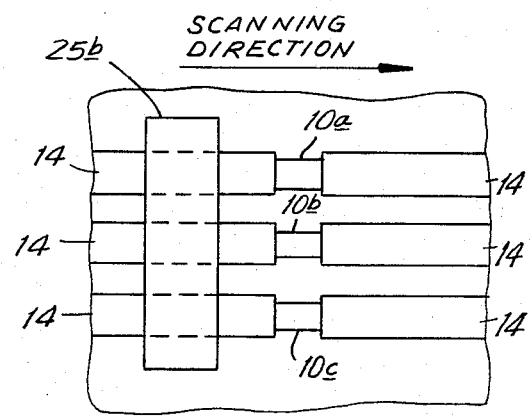
FIG. 8 is a diagrammatic top plan view showing a plurality of cups in accordance with the present invention being scanned by an electron beam from the apparatus of FIG. 1.

Referring now to FIG. 8, it will be seen that a plurality, for example, three of the Faraday cups 10a,10b and 10c in accordance with the present invention can be formed on a single substrate for use in measuring the current distribution along impact area 25a. More particularly, as impact area 25a travels in a direction transverse to the length of its strip-shaped cross-section, each of the Faraday cups 10a–10c produces a respective current which flows through a corresponding electrode 14 and which is measured by appropriate equipment (not shown). From the measured current flows produced by the several cups, the distribution of current along the length of impact area 25a is determined.

It will be appreciated from the foregoing, that the present invention provides a new and improved method and apparatus for measuring the energy density, current density, width and current distribution of an electron beam of generally strip-shaped cross-section. In particular, the present invention makes possible the accurate measurement of the above-noted electron beam parameters without regard to the incident angle at which the electron beam approaches the cup opening.

Having specifically described illustrative embodiments of the invention with reference to the accompanying drawings, it is to be understood that the invention is not limited to those precise embodiments and that various changes and modifications may be effected therein by one skilled in the art without departing from the scope and spirit of the invention as defined in the appended claims.

What is claimed is:

1. A method of controlling the generation and focus of an electron beam of generally strip-shaped cross section by a gun which includes anode, cathode and grid electrodes and focusing means operable for providing a focusing field, comprising the steps of:
    effecting a relative displacement of said electron beam across Faraday cup means, which has an opening with a maximum dimension less than the width of said strip-shaped cross section, in a direction transverse to the length of said strip-shaped cross section, so that said electron beam bombards said Faraday cup means through said opening;
    measuring the flow of current produced by said cup means in response to bombardment thereof by said electron beam; and
    controlling at least one of said width and the current density and current distribution of said beam in accordance with said measured current flow.

2. A method of controlling the generation and focus of an electron beam of generally strip-shaped cross-section as in claim 1; in which said controlling includes adjusting a distance between said electrodes in accordance with said measured current flow.

3. A method of controlling the generation and focus of an electron beam of generally strip-shaped cross-section as in claim 1; in which said controlling includes varying the power supplied to at least one of said electrodes in accordance with said measured current flow.

4. A method of controlling the generation and focus of an electron beam of generally strip-shaped cross-section as in claim 1; in which said controlling includes varying the strength of said focusing field in accordance with said measured current flow.

5. Apparatus comprising:
    means for generating an electron beam of generally strip-shaped cross section;
    a Faraday cup for use in measuring the energy density of said electron beam while the Faraday cup is scanned by the electron beam, said cross section having a given width at a location along the beam where the latter is to scan said cup; said cup comprising:
    a substrate having a cavity in a surface thereof;
    a layer of electrically conductive material next adjacent to and conforming to said surface of the substrate;
    a first layer of electrically isolating material having an aperture extending therethrough and located above said cavity, said first layer of electrically isolating material being substantially level and next adjacent to said layer of electrically conductive material except at margins of said aperture where said first layer of electrically isolating material overhangs said cavity; and
    a metallic layer next adjacent to said first layer of electrically isolating material and which has an opening aligned above said aperture, said opening having a maximum dimension less than said width.

6. Apparatus as in claim 5; wherein said layer of electrically conductive material forms a surface of said cavity.

7. Apparatus as in claim 6; further comprising a second layer of electrically isolating material interposed between said substrate surface and said layer of electrically conductive material so as to be next adjacent to and conforming to said substrate surface and said layer of electrically conductive material.

8. Apparatus as in claim 7; wherein said substrate is a single crystal semiconductor.

* * * * *